(12) United States Patent
Schulte et al.

(10) Patent No.: US 7,924,597 B2
(45) Date of Patent: Apr. 12, 2011

(54) DATA STORAGE IN CIRCUIT ELEMENTS WITH CHANGED RESISTANCE

(75) Inventors: Donald W. Schulte, Albany, OR (US); David D. Hall, Corvallis, OR (US); Terry Mcmahon, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 153 days.

(21) Appl. No.: 11/981,936

(22) Filed: Oct. 31, 2007

(65) Prior Publication Data

US 2009/0109725 A1  Apr. 30, 2009

(51) Int. Cl.
*G11C 17/00* (2006.01)
(52) U.S. Cl. ........ 365/96; 365/205; 365/207; 365/225.7
(58) Field of Classification Search .................... 365/96, 365/225.7, 205, 207
See application file for complete search history.

(56) References Cited

U.S. PATENT DOCUMENTS

| | | | |
|---|---|---|---|
| 6,166,421 A | 12/2000 | Kalnitsky et al. | |
| 6,337,507 B1 * | 1/2002 | Bohr et al. | 257/529 |
| 6,368,902 B1 * | 4/2002 | Kothandaraman et al. | 438/132 |
| 6,532,568 B1 | 3/2003 | Kotowski | |
| 6,670,824 B2 | 12/2003 | Goodbread et al. | |
| 6,756,255 B1 | 6/2004 | Thuruthiyil et al. | |
| 7,029,955 B2 | 4/2006 | Kothandaraman | |
| 7,057,941 B2 | 6/2006 | Wuidart et al. | |
| 2003/0179011 A1 | 9/2003 | Goodbread et al. | |
| 2005/0052892 A1 * | 3/2005 | Low et al. | 365/94 |
| 2005/0221540 A1 * | 10/2005 | Fischer et al. | 438/132 |
| 2006/0108662 A1 * | 5/2006 | Kothandaraman et al. | 257/528 |
| 2007/0007621 A1 * | 1/2007 | Omura et al. | 257/529 |
| 2007/0008382 A1 * | 1/2007 | Hatsui et al. | 347/61 |
| 2008/0100411 A1 * | 5/2008 | Tofigh et al. | 337/163 |

FOREIGN PATENT DOCUMENTS

| | | |
|---|---|---|
| EP | 1426969 A2 | 6/2004 |
| JP | 62-179762 | 8/1987 |
| JP | 06-021228 | 1/1994 |

* cited by examiner

*Primary Examiner* — Hoai V Ho

(57) ABSTRACT

A method of storing data in an array of circuit elements, said method comprising injecting a current into selected circuit elements, said current causing a persistent change in a resistance of said selected circuit elements from a first resistance to a second higher resistance indicative of a binary data bit, wherein said current does not break an electrical circuit in which said circuit element is disposed.

18 Claims, 6 Drawing Sheets

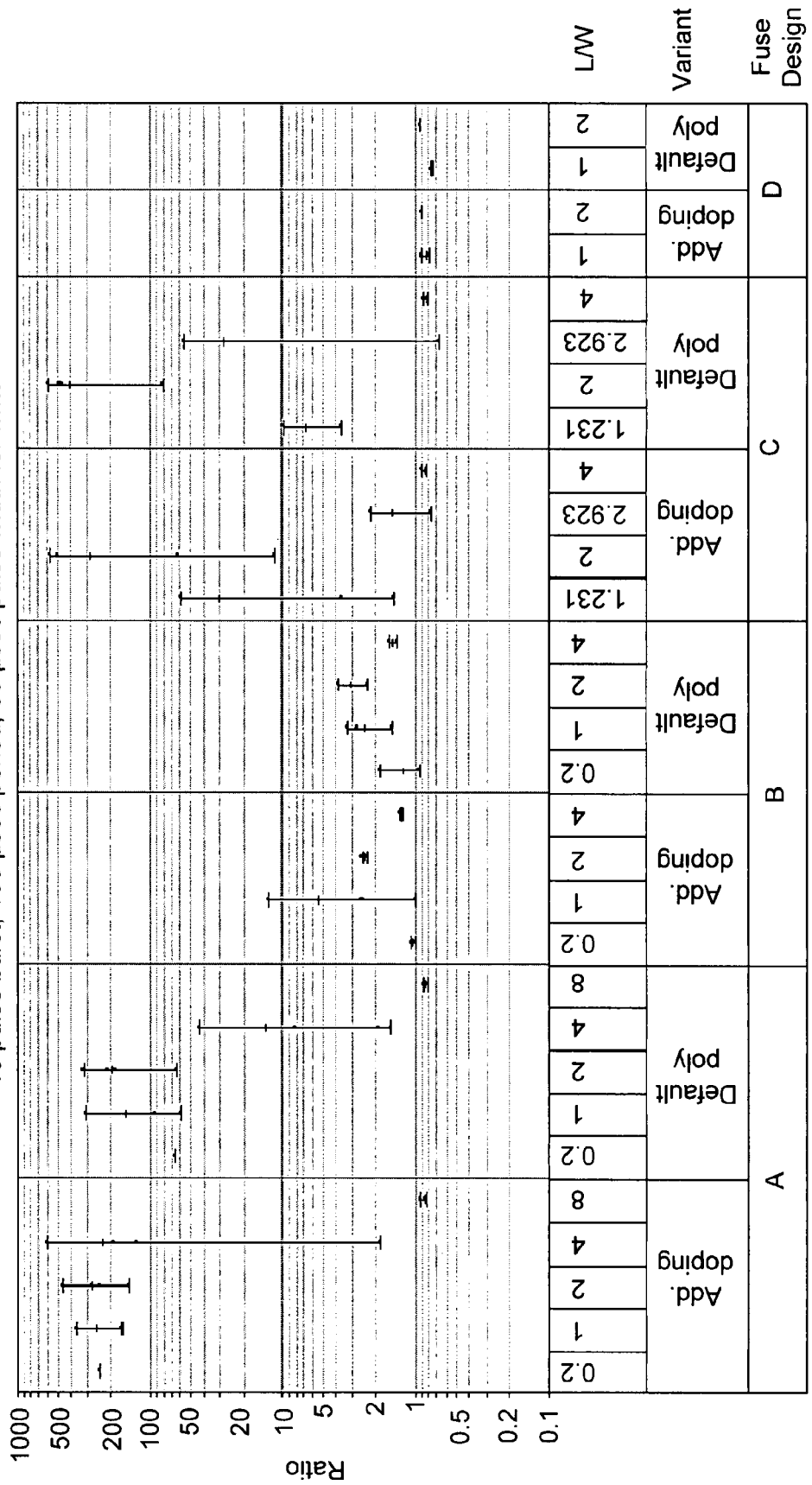

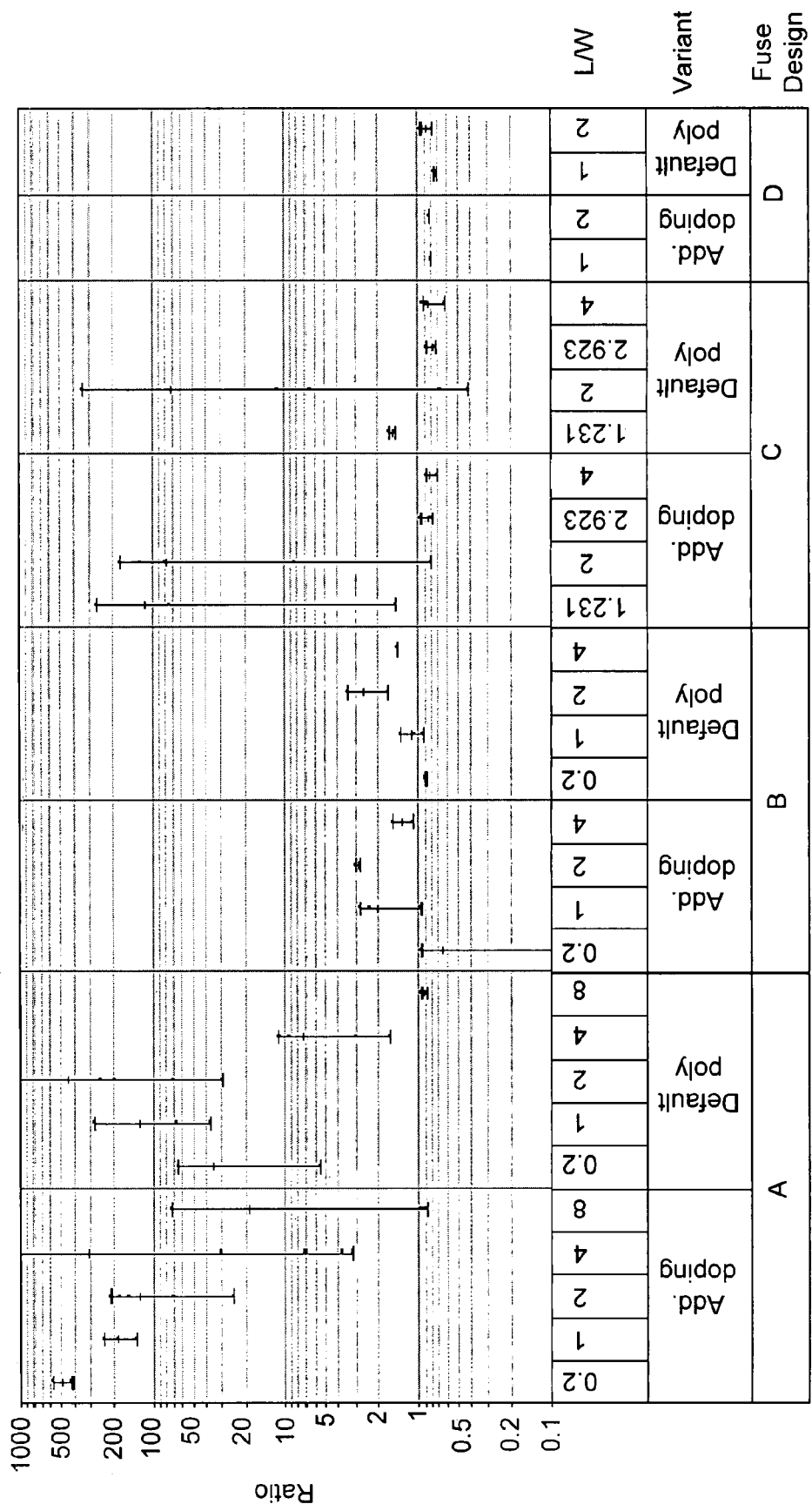

US 7,924,597 B2

DATA STORAGE IN CIRCUIT ELEMENTS WITH CHANGED RESISTANCE

BACKGROUND

Fuse arrays are used as nonvolatile memory blocks for the storage of binary data. The memory blocks are typically programmed by selectively "blowing" certain fuses while leaving others in their conductive state. To "blow" a fuse, high voltages and currents are passed through the fuse, generating enough heat to melt the fuse element. This type of memory can be written once and is then Read Only Memory (ROM).

The high voltages and currents used to program such a memory block present several issues that have to be addressed. For example, a separate high voltage power supply and additional circuitry are needed. Additionally, parasitic resistances within the fuse and its connections can create undesirable effects. Also, collateral damage to surrounding structures in the integrated circuit may occur when a fuse is blown.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 10 is a chart that illustrates the resistance shift of various illustrative fusible links as a result of programming, according to principles described herein.

FIG. 11 is a chart that illustrates the resistance shift of various illustrative fusible links as a result of programming, according to principles described herein.

Throughout the drawings, identical reference numbers designate similar, but not necessarily identical, elements.

DETAILED DESCRIPTION

Figure 2:
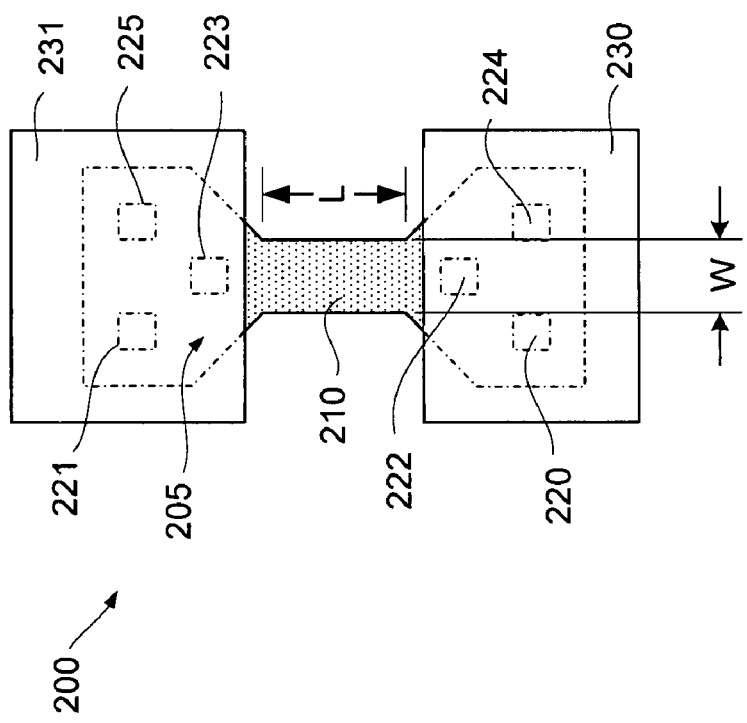
FIG. 2 is top view of an embodiment of a fusible link, according to principles described herein.

Electronic circuit elements that are capable of maintaining two distinct and discernible logic states may be used to store binary information. One electronic circuit element that may be used to store binary information is a fusible link or fuse. Fuses are typically formed in integrated circuitry as a strip of electrically conductive material having as one logic state a conductive path through the fuse and, as an opposite logic state, a fused open or non-conductive condition.

Typically a collection of fuses are used to form an array or matrix of fuses (often referred to as memory blocks) for storing binary data. The memory blocks may be programmed with binary data by selectively blowing certain fuses while leaving others in their conductive state. Memory blocks created from an array or matrix of fuses (such as programmable read only memory, or PROM) are nonvolatile memory because the state of the fuses that comprise the memory block do not change once electrical power is removed. PROM or other types of nonvolatile memory that utilize fuse arrays are useful for storing data or programs permanently.

A variety of conductive materials can be used to create fuses such as metals and polysilicon. For convenience of explanation, polysilicon will be referred to as the fuse material throughout the specification. It is understood, however, that a variety of suitable materials could used to form a fuse or fuse array.

Polysilicon sheets or strips are fabricated using conventional semiconductor processes to form polysilicon resistors that can be selectively blown or fused open. The polysilicon fuse matrix is typically constructed with all fuse bits reading "1." The desired binary data can be programmed into the fuse matrix by burning or "blowing" selected fuses to read as "0."

A fuse is burned or "blown" by passing high current pulses through the fuse that are not encountered during normal operation, typically in the 10's of milliamps range. In some cases reaching these current levels may require the application of voltages as high as 12-40 volts across the fuse. The high current passed through the fuse generates enough heat to melt the fuse element, opening the circuit and preventing further electricity from passing through the fuse. Because the fuse element is melted, the process of programming the array fuses is irreversible and can be done only once.

In general, polysilicon fuses and resistors operate reliably over wide temperature ranges and are electrically, mechanically, and chemically stable. Additionally, arrays of fuses can be built into integrated circuits, rather then as discrete components. Arrays of fuses are well suited to applications where high reliability, permanent data storage, fast access, and moderate price are important.

However, when such a fuse array comprises a part of a larger integrated circuit, the high voltages and currents used for programming the fusible links may present several issues that have to be addressed. For example, a separate high voltage power supply and additional circuitry may be needed. Additionally, parasitic resistances within the fuse and its connections can create undesirable effects. Also, collateral damage to surrounding structures in the integrated circuit may occur when a fuse is blown.

In these cases the high voltage and currents used to program a fuse array are typically supplied by a separate high voltage power supply. Additional circuitry and traces, such as higher power metal oxide semiconductor field effect transistors (MOSFETs) for programming and level shift circuitry for reading may be needed. This additional power supply and circuitry adds to the overall complexity of the integrated circuit and takes additional space, making the electronic component larger and more expensive.

Parasitic resistances within the fuse and its connections can present several issues. The parasitic resistances typically are in series with the fuse element resistance in the portion of the fuse where heating is desired and add to the total resistance of the fuse. Because of the parasitic resistances, higher voltages across the fuse are required to obtain the desired current flow through the fuse element. During programming, the parasitic resistances also dissipate energy, thereby reducing the energy available to heat the active portion of the fuse and increasing the programming difficulty.

Another challenge of designing and using fuse arrays in memory blocks results from the damage caused to the structure of the integrated circuit when the individually selected fuses are blown. The process of blowing the fuses generates heat with corresponding thermal expansion of surrounding materials, rapidly expanding gases and the flow of melted fuse material. In many cases, the damage from fuse programming is sufficient to result in cracks and/or ruptures that extend from the melted fuse through all of the overlying thin film layers. In such cases, a direct path between the melted fuse bit and die surface is present. This provides a path for moisture and impurity ingress, which can alter the programmed state of the fuse bit. All of these effects result in reduced reliability of the fuse array as a memory device and the integrated circuit relying on that memory.

Damage to the functional structures (such as traces, transistors, etc.) surrounding the fuses can also result from programming a fuse array. This damage can be avoided to some extent by isolating the fuse array from other components and eliminating metal traces that overlay the fuses. These design constraints are not space effective and increase the size and cost of the electronic component.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The present specification described a novel fuse design and method of programming the same. As described below, improvements to the electrical connections, geometry, and doping associated with a fuse can result in significant increases in the reliability of a fuse array and minimize the collateral damage to surrounding structures during programming. Additionally, these modifications can allow the fuse array to be programmed using 5 volt circuitry and power supplies, thereby reducing the size, complexity, and cost of the integrated circuit.

Figure 1:
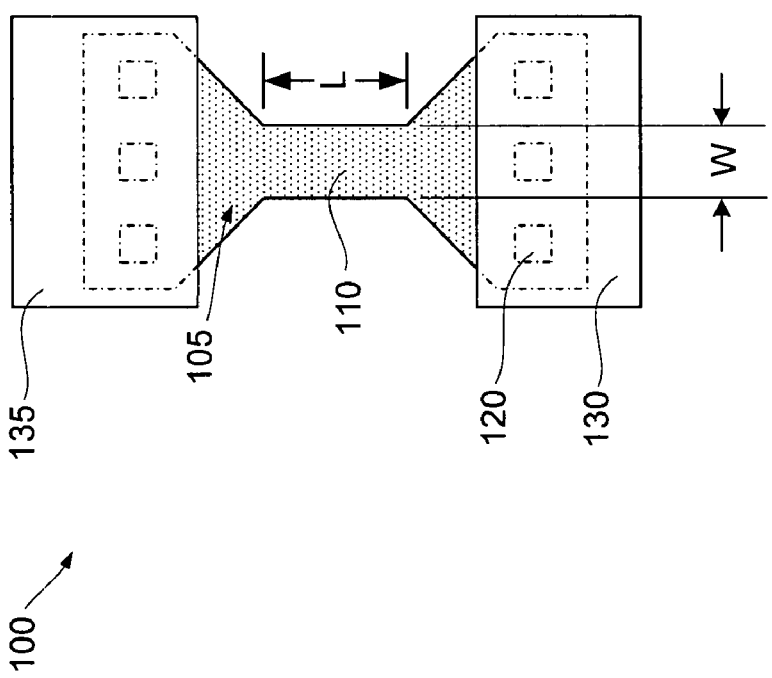
FIG. 1 is top view of one embodiment of a fusible link, according to principles described herein.

FIG. 1 is top view of a fusible link (100). The fusible link (100) is comprised of a polysilicon body (105), conductive leads (130, 135), and a plurality of contacts (120). The individual components of the fusible link are deposited and shaped using standard semiconductor processes such as chemical vapor deposition and photolithography. In this illustrative example, the polysilicon body (105) is "dog bone" shaped, with wider ends and a narrow center fuse element (110). The narrow fuse element (110) is described by two dimensions, a length (L) and a width (W).

Also shown in FIG. 1 are conductive leads (130, 135) that are deposited above the polysilicon body (105). The conductive leads (130, 135) make electrical connections with the polysilicon body (105) through a plurality of contacts (120) that are interposed between the conductive leads (130, 135) and the polysilicon body (105). During programming, electrical current flows through the conductive leads (130, 135), down the contacts (120) and across the polysilicon body (105). Similarly, when the memory array is read, the state of the fuse (open/blown or conductive) is sensed through the electrical connection created by the conductive leads (130, 135) and contacts (120).

Typically, reading the memory array comprises determining the magnitude of electrical resistance present in each of the fusible links (e.g., 100) in the array. For example, if the resistance of a particular link is high, such as when a fuse is "blown" or in an open state, that fuse could represent a binary value of "0." If, however, the fuse has a low resistance, such as when the fuse creates a good electrical connection between the leads (130, 135), the fuse could represent a binary value of "1."

A matrix of fuses can be programmed to contain binary data by passing high voltages and/or current through selected fuses to change the resistance of those selected fuse elements (110). When sufficiently high voltages and/or currents are passed through a selected fuse element (110), the physical nature of the fuse element (110) is altered. For example, during programming, a high voltage and/or current could be passed through a selected fuse element (110), raising the temperature of the polysilicon material above its melting point. The polysilicon material melts and flows away from the fuse (110), breaking the electrical connection between the leads (130, 135) and creating an open circuit. Following successful programming, the matrix of fuses can then be read to retrieve binary data by sensing the electrical resistance of each of the fuses.

FIG. 2 is top view of another illustrative fusible link (200). The fusible link (200) is comprised of a polysilicon body (205), conductive or metallic leads (230, 231), and a plurality of contacts (220-225) between the polysilicon body (205) and the leads (230, 231). As shown in FIG. 2, the contacts (220-225) may be arranged in triangles. As described above, the polysilicon body (205) is "dog bone" shaped, with wider ends and a narrow center fuse element (210). The polysilicon body (205) is formed using standard wafer processes and can be shaped and sized as desired within the limits of the process. The narrow fuse element (210) is described by two dimensions, a length (L) and a width (W). The length (L) and width (W) can be varied to change the resistance and other characteristics of the fuse (200). Leads (230, 231) are deposited above the polysilicon fuse (210). As indicated, the leads (230, 231) make electrical connections with the polysilicon fuse body (110) through a plurality of electrical contacts (220-225) that are interposed between the conductive leads (230, 231) and the polysilicon fuse body (110).

The polysilicon fuse (200) may be electrically represented as plurality of resistors connected in series. For example, the electrical resistance of the first set of contacts (220, 222, 224) is a first resistance, the portion of the polysilicon body (205) between the contacts (220, 222, 224) and the narrow fuse element (210) have a second resistance, the fuse element (210) itself has a third resistance, the portions of the polysilicon body (205) between the second set of contacts (221, 223, 225) and the fuse element (210) provide a fourth resistance, and the second set of contacts (221, 223, 225) provides a fifth resistance.

The first, second, fourth and fifth resistances are often called parasitic resistances because they are present but add no benefit to the functionality of the circuit. Minimizing parasitic resistance provides a number of advantages including allowing lower voltages to pass sufficient current through the fuse body for programming and producing less heating in the parasitic portions of the fuse element.

FIG. 2 shows an alternative arrangement that extends the leads (230, 231) farther over the polysilicon fuse material and places specific contacts (222, 223) as close to the actual fuse element (210) as possible. This additionally reduced the total distance between these specific contacts (222, 223). In some embodiments, the minimum distance between the contacts (222, 223) may be dictated by limitations in the manufacturing process. By minimizing the amount of polysilicon between the contacts (222, 223) and the fuse element (210), the second and fourth resistance values are significantly reduced.

For example, a typical value for the sum of the series of resistances in a fuse link (200) may be 200 ohms. The fuse element (210) itself may have a resistance of 100 ohms, with the remaining 100 ohms generated by the parasitic resistances. By shifting some of the contact locations (e.g., 222, 223) as close to the fusible link as the manufacturing process allows, the parasitic resistance may be reduced by 30-50 ohms.

Figure 3A:
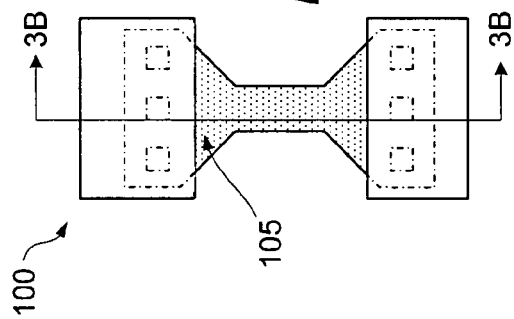
FIGS. 3A and 3B are a top view and a cross-sectional diagram, respectively, of an embodiment of a fusible link, according to principles described herein.
Figure 3B:
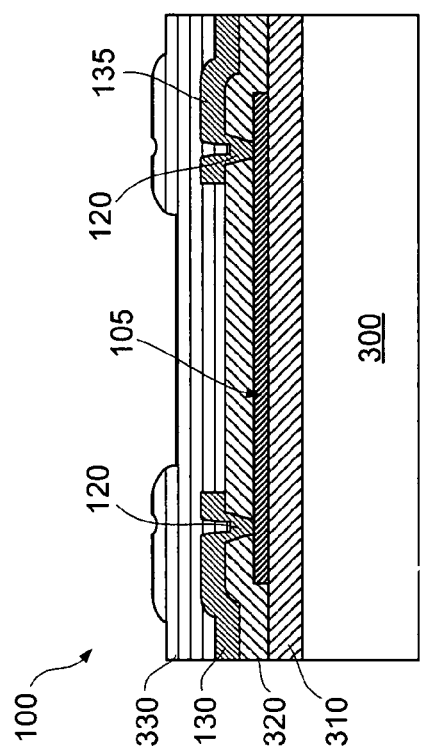

FIGS. 3A and 3B are a top view and a cross-sectional diagram, respectively, of a fusible link (100). FIG. 3A shows a top view of fusible link (100) with a line (3B) indicating the location and viewing direction of the cross-sectional diagram shown in FIG. 3B. FIG. 3B shows additional structural details of a fusible link (100). The bottom-most layer is a silicon substrate (300). The next layer is a field oxide layer (310). Field oxide is a layer of relatively thick oxide (typically 100-500 nm) deposited on the silicon substrate (300) to passivate and insulate the silicon substrate (300). The field oxide layer (310) typically does not actively participate in the operation of the microelectronic device.

In one illustrative embodiment, the polysilicon body (105) is formed on the field oxide layer (310). An upper silicon oxide insulating layer (320) is deposited on top of the polysilicon body (105). A plurality of vias (500, FIG. 5) are formed in the upper insulating layer (320). Vias are small openings in an insulating oxide layer that allow electrical interconnection between two different conducting or semiconducting layers. As the conductive layer that forms the leads (130, 135) and contacts (120) is deposited, a portion of the deposited conductive material enters the vias and makes an electrical connection with the polysilicon body (105) below. The filled vias form the plurality of contacts (120) between the conductive leads (130, 135) and the polysilicon body (105).

Another upper insulating layer (330) is deposited on top of the conductive leads (130, 135) and the insulating layer (320). Additional layers (not shown) may be deposited above the upper insulating layer (330). By way of example and not limitation, the additional layers may include metal routing layers, insulating layers, and passivation layers.

The processes of forming the polysilicon fuses, as described above, may be particularly compatible with methods that simultaneously form transistor gates on other regions of the silicon substrate (300). It will be appreciated by those of skill in the art that the geometry, materials, and processes illustrated can be altered to some degree without departing from the principles disclosed herein.

Figure 4A:
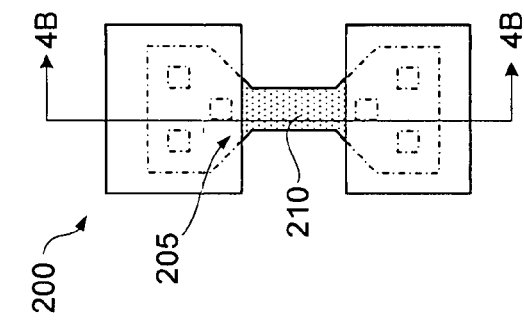
FIGS. 4A and 4B are a top view and a cross-sectional diagram, respectively, of an embodiment of a fusible link, according to principles described herein.
Figure 4B:
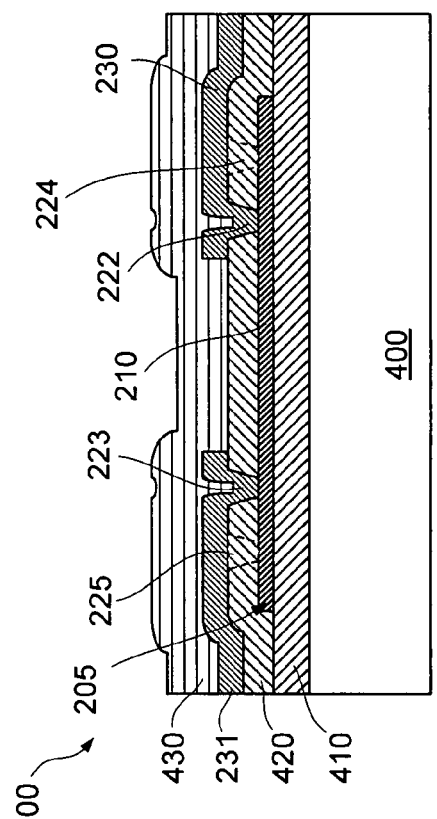

FIGS. 4A and 4B are a top view and a cross-sectional diagram, respectively, of an illustrative fusible link (200), according to principles described herein. FIG. 4A shows a top view of the fusible link (200) with a line (4B) indicating the location and viewing direction of the cross-sectional diagram shown in FIG. 4B. FIG. 4B shows additional structural details of a fusible link (200).

As described above, the fusible link (200) is formed on a field oxide layer (410) that overlies a silicon substrate (400). Although the fusible link (200) may be deposited in other locations, in many instances it could be desirable to form the fuse on a thick and robust layer such as the field oxide layer (410). Other layers, such as the gate oxide layer (not shown) are significantly thinner and more fragile than the field oxide layer (410) and may be more easily damaged. The polysilicon body (205) is created from the polycrystalline form of silicon and can be deposited onto substrates using a variety of methods, such as low-pressure chemical vapor deposition. Polysilicon can be either N or P doped and additional implants can be used to increase the impurity levels.

As shown in FIG. 4B, the conductive leads (230, 231) extend a greater distance over the polysilicon body (205) than the leads (130, 135) shown in FIGS. 3A and 3B. Further, the vias (600, FIG. 6) in the silicon oxide insulating layer (420) above the polysilicon body (205) are staggered, with at least one of the vias being placed as close to the fuse element (210) as the manufacturing process allows. This creates electrical contacts (222, 223) between the conductive layer (230, 231) and the fuse element (210) that minimize the parasitic resistances present in the fuse. Another upper insulating layer (430) is deposited on top of the conductive leads (130, 135) to encapsulate and protect the lower layers.

Figure 5:
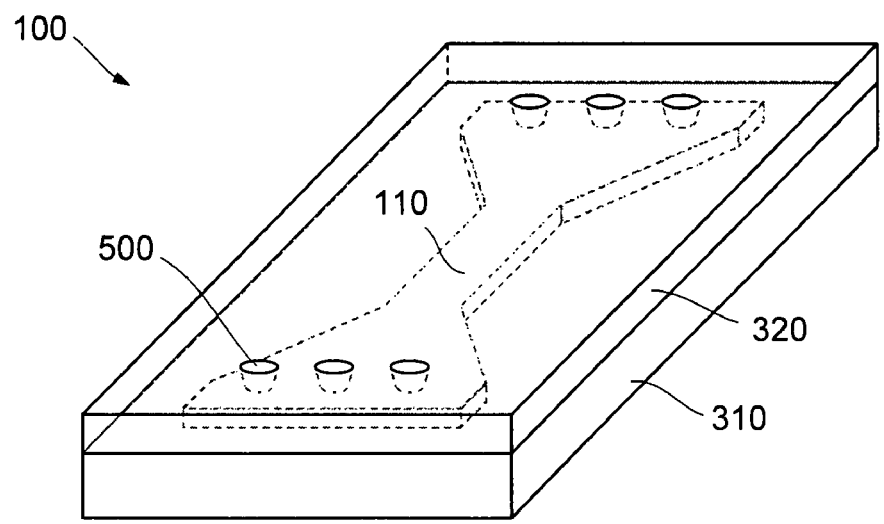
FIG. 5 is a perspective view of an embodiment of a fusible link, according to principles described herein.

FIG. 5 is a perspective diagram of a fusible link (100), showing the field oxide layer (310) below the polysilicon body (110) and a silicon oxide insulating layer (320) deposited above the polysilicon body (110). The silicon oxide insulating layer (320) has a number of vias (500) etched or otherwise formed in each end above the polysilicon body (110). The vias are later filled with a conductive or metallic layer that forms the conductive leads (130, 135) and contacts (120).

Figure 6:
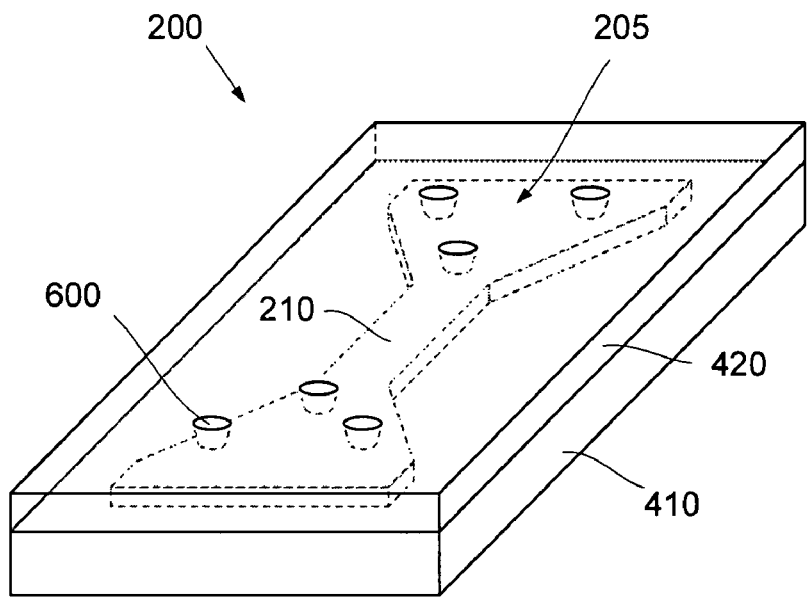
FIG. 6 is a perspective view of an embodiment of a fusible link, according to principles described herein.

FIG. 6 is a perspective view of an illustrative fusible link (200). Similar to the fusible link illustrated in FIG. 5, the polysilicon body (210) is sandwiched between the field oxide layer (410) and the silicon oxide insulating layer (420). In this case, the vias have been staggered to place at least one of the vias as close as possible to the fuse element (210).

Figure 7:
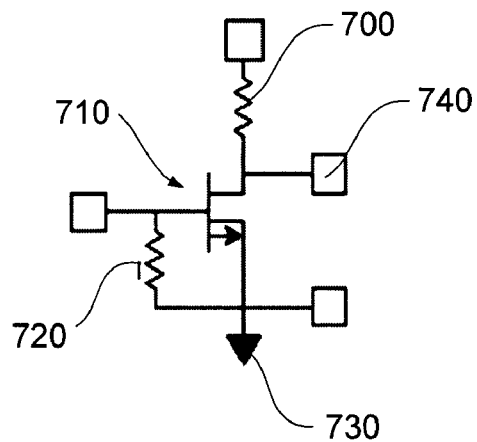
FIG. 7 is a diagram of an embodiment of an illustrative system of electrical components attached to a fusible link, according to principles described herein.

FIG. 7 is a diagram of an illustrative system of electrical components attached to a fusible link to test the characteristics of various fuse designs. The fusible link (700) is represented as a resistor (700) in the diagram. Each fusible link (700) in the test piece is connected to a single standard N-channel metal oxide semiconductor field effect transistor (n-MOSFET) (710). A 25 k ohm pull-down resistor (720) is connected to ground (730) to ensure that the fusible link (700) could not be inadvertently programmed. A plurality of probe pads (740) provides access to the electrical components for probes and other instrumentation.

Figure 8:
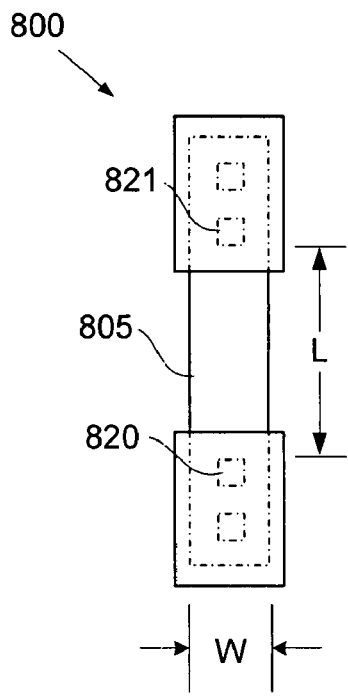
FIG. 8 is a top view of an embodiment of an illustrative fusible link, according to principles described herein.

In addition to the design generally illustrated in FIGS. 2, 4A, 4B, 6 (hereinafter referred to as design A) and the design generally illustrated in FIGS. 1, 3A, 3B, and 5 (hereinafter referred to as design B), two other fusible link designs as disclosed. FIG. 8 is a top view of an illustrative fusible link, hereinafter referred to as design C. As opposed to the dogbone shaped polysilicon body (105, FIG. 1; 205, FIG. 2) used by design A and design B, the polysilicon body (805) of design C has a rectangular shape with a length (L) and a width (W). The length (L) is measured between the closest contacts (820, 821). The width (W) is constant along the length of the polysilicon body (805).

Figure 9:
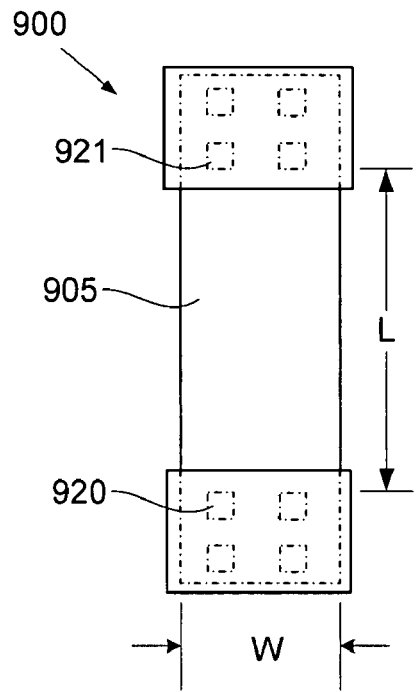
FIG. 9 is a top view of an embodiment of an illustrative fusible link, according to principles described herein.

Similarly, FIG. 9 is a top view of an illustrative fusible link (hereinafter referred to as design D). Design D has a polysilicon body (905) that is generally rectangular with a length of (L) and width of (W). The length (L) is also measured between the closest contacts (920, 921).

Initial experiments indicated that permanent resistance increases on the order of 2 to 4 times the original fuse value can be obtained with 7.5V 300-500 μsecond pulses applied directly across a design B fuse bit. This level of resistance shift could easily be used for data storage through the use of a properly designed detection circuit.

FIG. 10 is a chart that illustrates the resistance shift of various illustrative fusible links, according to principles described herein. The vertical axis of the chart is a logarithmic scale of the ratio of the post programming final resistance of the fuse (Rfinal) divided by the preprogramming resistance of the fuse (Rinitial).

The horizontal axis classifies the test results by fuse design, doping concentration, and the ratio of the fuse length (L) to the fuse width (W). The ratio of the fuse length (L) to fuse width (W) corresponds to resistance differences between various fuse designs. In general, the resistance of a conductor with uniform current density and a regular cross-section is proportional to the length of the conductor and inversely proportional to the width of the conductor according to the formula:

$$R=(L*\rho)/A$$

where

L is the length of the conductor in meters;

A is the cross-sectional area in square meters (width*thickness); and $\rho$ is the electrical resistivity of the material in ohm*meters.

Thus, a fuse with a length of 2 and a width of 1 would have a length to width ratio of 2. A second fuse with a length of 4 and a width of 1 would have a length to width ratio of 4 and have a correspondingly greater resistance. The variable $\rho$ is the electrical resistivity (also known as specific electrical resistance or sheet resistance) of the polysilicon material used to form the fuse element. The electrical resistivity $\rho$ is affected by levels of dopant or other impurities added to the silicon. The more heavily doped the polysilicon is, the lower its electrical resistivity.

The resistance of the conductor determines the amount of current that passes through the conductor for a given voltage according to the formula:

$$I=V/R$$

where

I is the current measure in amperes;

V is the voltage across the conductor; and

R is the resistance of the conductor.

Lower resistances allow greater current to be passed through the conductor for a given voltage. Thus, fuse elements with lower L/W ratios have lower resistance (shown on the left within each subcategory of fuses in FIG. 10 and FIG. 11) and conduct more current than fuse elements with a higher L/W ratio (shown on the right within each subcategory of fuses in FIG. 10 and FIG. 11).

When a current I is passed through a conductor of resistance R, electrical energy is converted to heat at a rate equal to $$P=I^2*R$$

where

P is the power dissipated (measured in watts);

I is the current (measured in amperes); and

R is the resistance (measured in ohms).

Thus, for a given voltage, both the current passed through a conductor and the power dissipated by the conductor are a function of the resistance of the conductor. Power is dissipated within an electrical conductor by converting electrical energy into heat. In a polysilicon fuse, the conversion of the electrical energy passing through the fuse into heat raises the temperature of the fuse element.

At energy densities below the level at which the fuse would melt or "blow," changes can still occur within the polysilicon fuse element which permanently increase the electrical resistance of the fuse in a manner that allows the fuse to selectively represent a binary bit of data. By way of example and not limitation, changes in the crystalline structure (or phase) of the polysilicon can occur which increase the electrical resistance ($\rho$) of the material. The heat generated by the passage of electrical currents through the polysilicon body can also cause movement, clustering or agglomeration of the dopant molecules within the polysilicon structure, which increase the electrical resistivity of the material.

These effects, individually, in combination, or in combination with other effects can significantly increase the resistance of the polysilicon fuse without requiring the fuse to be "blown." By changing the resistance of the fuse without reaching temperatures required to "blow" or melt the fuse, data can still be written to the fuse array, while the collateral damage possible when fuses are melted or blow can be reduced or eliminated. Further, lower programming voltages and/or currents can be used.

The parasitic resistances also generate heat when current is passed through the fuse element. The heat generated by parasitic resistances can contribute to the damage of the integrated circuit structure and layers. Minimizing the parasitic resistances focuses the heat generation within the fuse element and reduces the superfluous heat that is generated during programming. Further, by minimizing the parasitic resistances, the overall resistance of the fuse is reduced, allowing lower voltages to generate sufficient current through the fuse element.

Returning to FIG. 10, the statistical distribution of the Rfinal/Rinitial data for each fuse subcategory is represented as a vertical line with a bar at each end. The bars at each end of the line represent a measure of the statistical dispersion of each data set. A shorter bar interposed between the two end bars and lying across the vertical line represents the population mean of the data set.

FIG. 10 represents the results of a 5 volt pulse chain applied across the polysilicon body of the fusible links. The pulse chain consisted of 10 pulses, with a 100 μsecond period and a 50 μsecond pulse width, for a total write time of 1 millisecond.

For designs with L/W ratio where significant shifts were observed, the ratio of Rfinal/Rinitial for design A ranged from about 60-600. For design A, the subset of fuses with additional doping had higher resistance shifts than the undoped subset. The doped subset with an L/W ratio of 0.2 showed the smallest amount of statistical dispersion. The dispersion increased as the L/W ratio for the design A subsets progressed from 0.2 to 4. For the L/W ratio of 8, very little shift in resistance was observed, possibly due to the higher preprogramming fuse resistance of this subset. The subset of design A with default doping showed lower resistance shifts and fewer distinct trends in statistical dispersion when compared to the subset with additional doping.

Similarly, Rfinal/Rinitial ranged from 1-12.5 for design B, and from 1.5-595 for design C. The fuse subsets of design B showed significantly less shift in resistances when compared with design A. Design C had a broader statistical dispersion in Rfinal/Rinitial data for the L/W ratios of 1.2 and 2 than the corresponding data sets of design A. This broader statistical dispersion could indicate that if design C was used in a fuse array, the value of programmed fuses could vary more widely than if design A was used. By way of example and not limitation, if a fuse C design with additional doping and a L/W ratio of 2 was programmed with a 10 pulse burst with a 100 μsecond period and 50 μsecond pulse width, the values of the programmed resistances could be expected to vary from about 10 to 500 times the initial resistance. However, a design A fuse of the same doping, L/W ratio, and programming pulse train would have resistances that only varied between about 150 and 350 times the initial resistance. The lower variation in Rfinal/Rinitial fuse values demonstrated by design A could result in higher reliability of the fuse array.

Design D had minimal shifts in resistance for all subsets, including additional doped fuses and default fuses.

These results clearly indicate that a useable 5V operating space exists for fuse design A with W=1 µm, L=2 µm or W=1 µm, L=1 µm. The results indicate that the additional doping had minimal effect on the initial fuse bit resistance, but resulted in an improvement in the ability to shift the fuse resistance.

FIG. 11 is a chart that illustrates the resistance shift of various illustrative fusible links. The vertical axis of the chart is a logarithmic scale from 0.01 to 1000. The ratios of the final resistance of the fuse (Rfinal) divided by the initial resistance of the fuse (Rinitial) are graphed on vertical axis. Similar to FIG. 10, the horizontal axis classifies the test results by fuse design, doping concentration, and the ratio of the fuse length (L) to the fuse width (W).

FIG. 11 represents the results of a 5 volt pulse chain applied across the polysilicon body of the fusible links. The pulse chain consisted of 10 pulses, with a 40 µsec period and a 20 µsec pulse width, for a total write time of 400 µsec.

Similar resistance shift results were obtained for write pulse bursts of 10 pulses of 20 µsec width and 40 µsec period. Data indicated that resistance shifts were permanent and stable. This indicates that programming at 5V is possible with a total write time of ~400 µsecond to 1 millisecond. The results indicate that the additional doping had minimal effect on the initial fuse bit resistance, but resulted in an improvement in the ability to shift the fuse resistance.

Results also indicate that permanent resistance shifts as large as 60 to 600 times the original value can be obtained on some designs using a 5V power supply and NMOS write FET. These shifts in resistance result in little or no thin film damage and should be easily detectable with on-chip circuitry.

The advantages of using a polysilicon resistance shift as the data bit storage mechanism of a fuse element include improved reliability, lower programming voltages, reduced PROM cell space, simplified circuitry, and compatibility with low voltage processes.

The reliability of the PROM memory is improved by using lower energy programming pulses to increase the resistance of the polysilicon fuse element, rather than fusing it open. By using lower energy programming pulses, the resistance of the fuse element can be significantly increased with little or no damage to the thin film layers surrounding the polysilicon fuse element. Since the thin film layers are not breached or cracked during the resistance shift, moisture ingress is prevented and the reliability of the programmed bit is improved.

As described herein, lower programming voltages, such as the 5 volt logic supply, can be used to shift the resistance of the polysilicon fuse elements to write a binary data bit. This eliminates the need for high voltage circuitry and level shifts. This allows for significantly more latitude in PROM design. The ability to reduce the programming voltage from the 12 to 40 volt range, down to 5 volts provides significant benefits. With 5 volt operation, the need for level shift circuitry between high voltage and the CMOS (Complementary Metal Oxide Semiconductor) logic is eliminated, simplifying both the programming and detection of programmed bits. By using CMOS logic for programming, other potential improvements such as simplified implementation of row/column multiplexing of the read and write operations would also be possible.

Another benefit of resistance shifting the fusible links without actually breaking selected links to store data is a reduction of the required PROM cell space. As mentioned above, current polysilicon fuse bits are placed at a significant distance from surrounding circuitry and are not covered by any metal lines to avoid collateral damage caused when the fuse elements are melted open. Since the resistance change fuse element described herein does not result in significant thin film damage, fuse bits can be placed closer to surrounding circuits and most likely under metal routing. Less energy is required to shift the resistance as opposed to fusing the element open; therefore smaller programming FETs can be used in the PROM cell. Experiments indicate that NMOS FETs with a width of ~200-250 µm and 1 µm gate length should be sufficient for writing. These changes should reduce the overall space required for each bit in the PROM circuit.

An additional advantage over other techniques of increasing the reliability of PROM memory is that no new processes are required beyond those used in creating the fusible link and its associated circuitry.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method of storing data in an array of single layer polysilicon link elements, said method comprising injecting a current into selected single layer polysilicon link elements by applying a burst of multiple voltage pulses to each of said selected single layer polysilicon link elements, said current causing a persistent change in a resistance of polysilicon material making up said selected single layer polysilicon link elements from a first resistance to a second higher resistance indicative of a binary data bit, wherein said current does not alter the geometric shape of said single layer polysilicon link elements.

2. The method of claim 1, wherein said current comprises a pulse train at 6 volts or less.

3. The method of claim 1, further comprising forming each said element with ends that taper to a narrower central section.

4. The method of claim 1, further comprising reading data from said array of elements by determining whether each element has said first or second resistance indicative, respectively, of different binary bits.

5. The method of claim 1, wherein each of said single layer polysilicon link elements is sandwiched between two insulating layers.

6. A data storage device including a circuit element comprising:
 a single layer polysilicon body, said body having a first end, a second end, and a central portion;
 a first plurality of electrical contacts interposed between a first lead and said first end such that said first lead is in electrical contact with said first end; and
 a second plurality of electrical contacts interposed between a second lead and said second end such that said second lead is in electrical contact with said second end;
 wherein an electrical resistance of said central portion is permanently increased without breaking electrical connectivity between said first end and said second end upon application of a programming current so as to indicate a particular binary data bit, said programming current being achieved by applying a burst of multiple voltage pulses across said central portion.

7. The device of claim 6, wherein said resistance of said central portion of said body is increased to indicate said particular binary data bit in response to a current pulse train at 6 volts or less.

8. The device of claim 6, where each of said first and second ends is wider than said central portion, said first and second ends tapering to said narrower central portion.

9. The device of claim 6, wherein said data storage device further comprises an array of said circuit elements, each representing a binary data bit in a resistance of a respective central portion of that circuit element.

10. The device of claim 9, wherein each said circuit element is disposed in a circuit for determining a resistance level of that circuit element indicative of a particular binary data bit.

11. The device of claim 6, wherein each polysilicon body is sandwiched between a field oxide layer and an insulating layer.

12. The device of claim 6, wherein said central portion has a length to width ratio of 4 or less.

13. The device of claim 6, wherein said central portion has a width of about 1 micron.

14. The device of claim 6, wherein said increase in resistance is at least 2 times greater than an initial value.

15. The method of claim 1, in which the burst of multiple voltage pulses are selected to cause a change in a crystalline structure of the polysilicon material making up the single layer polysilicon link which increases the electrical resistance of the polysilicon without causing a disruption in the geometric shape of the single layer polysilicon link.

16. The method of claim 1, in which the burst of multiple voltage pulses is applied to the single layer polysilicon link such that agglomeration of dopants within the polysilicon material making up the single layer polysilicon link increases the electrical resistance of the polysilicon material without causing the single layer polysilicon link to melt.

17. A single layer polysilicon link forming an undisrupted electrical pathway between a first contact and a second contact, the single layer polysilicon link having an initial low resistance state with dopants distributed through a grain structure of the single layer polysilicon link such that upon application of a burst of multiple voltage pulses through the single layer polysilicon link the dopants are aggregated to form a second high resistance state.

18. The link of claim 17, in which the ratio between the high resistance state is at least 60 times greater than the initial low resistance state, the difference in electrical resistances representing binary data values.

* * * * *